United States Patent
Bächler

(10) Patent No.: US 12,384,042 B2
(45) Date of Patent: Aug. 12, 2025

(54) METHOD FOR EQUIPPING A MOUNTING PLATE WITH EQUIPPING COMPONENTS OF A SWITCHGEAR AND/OR CONTROL SYSTEM

(71) Applicant: RITTAL GMBH & CO. KG, Herborn (DE)

(72) Inventor: Andreas Michael Bächler, Haiger (DE)

(73) Assignee: RITTAL GMBH & CO. KG, Herborn (DE)

( * ) Notice: Subject to any disclaimer, the term of this patent is extended or adjusted under 35 U.S.C. 154(b) by 105 days.

(21) Appl. No.: 17/637,928

(22) PCT Filed: Jun. 4, 2020

(86) PCT No.: PCT/DE2020/100468
§ 371 (c)(1),
(2) Date: Feb. 24, 2022

(87) PCT Pub. No.: WO2021/037297
PCT Pub. Date: Mar. 4, 2021

(65) Prior Publication Data
US 2022/0281116 A1 Sep. 8, 2022

(30) Foreign Application Priority Data
Aug. 29, 2019 (DE) ............... 10 2019 123 245.7

(51) Int. Cl.
*B23P 19/04* (2006.01)
*B25J 9/16* (2006.01)
(Continued)

(52) U.S. Cl.
CPC ............. *B25J 9/1697* (2013.01); *B23P 19/04* (2013.01); *B25J 9/1664* (2013.01); *B25J 11/005* (2013.01); *H05K 13/046* (2013.01)

(58) Field of Classification Search
CPC ......... B23P 19/08; B23P 19/105; B23P 19/12; B23P 19/10; H05K 13/046; B23B 2270/48; B25J 9/1697
See application file for complete search history.

(56) References Cited

U.S. PATENT DOCUMENTS 5,404,021 A   4/1995  Mangano et al.
6,360,950 B1  3/2002  Hoover-Szendre
(Continued)

FOREIGN PATENT DOCUMENTS

DE    4438525 A1       5/1996
EP    3421172 A1  *    1/2019  ............. B23P 19/04
WO    WO-0171437 A2    9/2001

OTHER PUBLICATIONS

German Written Opinion of the International Preliminary Examination Authority issued in PCT/DE2020/100468, mailed Jul. 16, 2021; IPEA/EP.

(Continued)

*Primary Examiner* — Christopher J. Besler
(74) *Attorney, Agent, or Firm* — Harness, Dickey & Pierce, P.L.C.

(57) ABSTRACT

The invention relates to a method for equipping a mounting plate with equipping components of a switchgear and/or control system, the method comprising the steps:
Reading planning data of a switchgear and/or control system into an automatic equipping machine, which has a equipping robot;
Extracting position data of at least one equipping component to be mounted on the mounting plate and/or at least one machining position of the mounting plate from the planning data;
Detecting a spatial orientation and/or a position of the mounting plate with an image processing system of the equipping robot;

(Continued)

Figure 1:
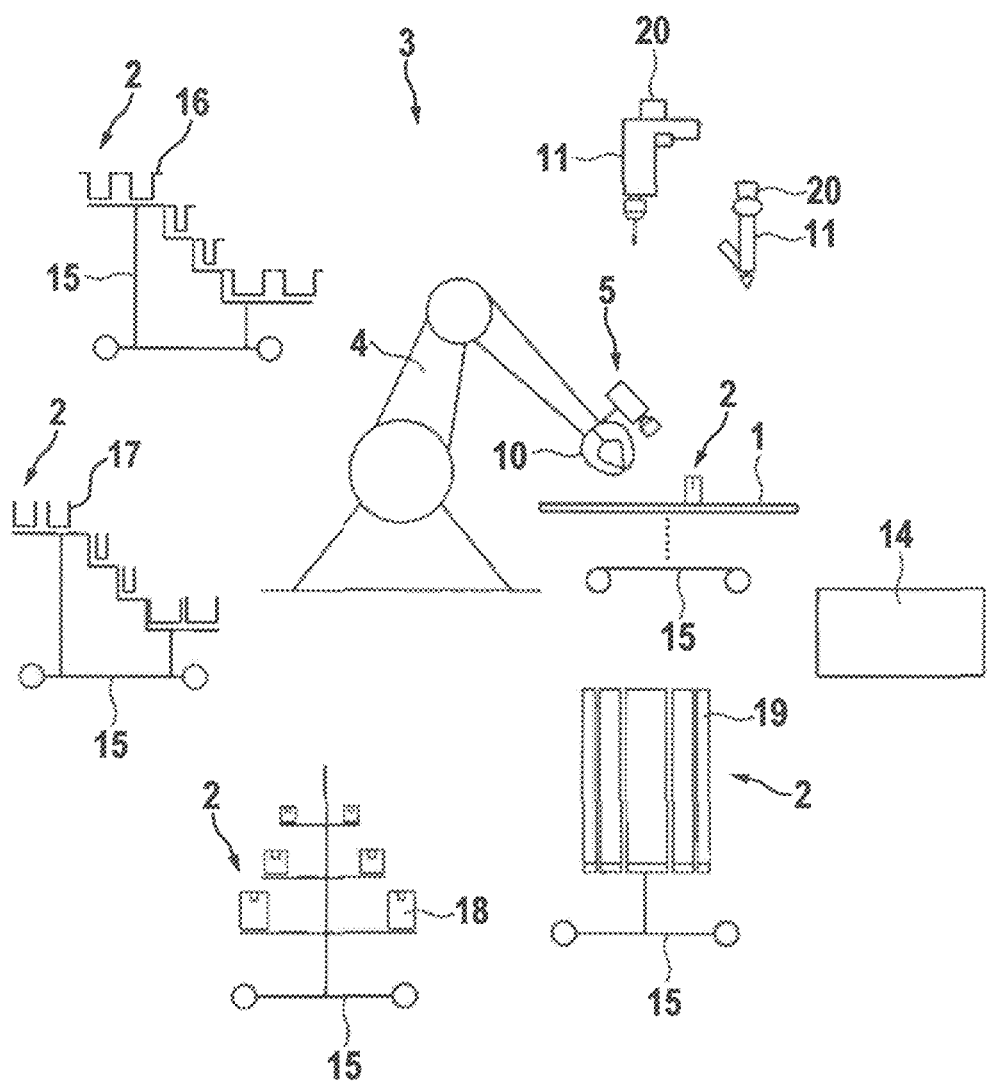

Assigning the position data to at least one position on the mounting plate; and

Execution of at least one processing or equipping step linked to the position on the mounting plate via the planning data at the position on the mounting plate with the equipping robot.

14 Claims, 5 Drawing Sheets

(51) Int. Cl.
    *B25J 11/00*    (2006.01)
    *H05K 13/04*    (2006.01)

(56) References Cited

U.S. PATENT DOCUMENTS

2015/0158176 A1    6/2015  Fujita et al.
2019/0193267 A1    6/2019  Peng et al.

OTHER PUBLICATIONS

English Translation of the International Preliminary Report on Patentability issued in PCT/DE2020/100468, dated Dec. 1, 2021; IPEA/EP.

Schaltschrankbau Magazin. "Anlagenbau, Industrie und Gebäude Schaltschrankbau Methoden—Komponenten—Workflow—Ausgabe 5 2018", *Schaltschrankbau Magazin*. Sep. 1, 2018 (Sep. 1, 2018), Retrieved from the Internet: https://www.schaltschrankbau-magazin.de/downloadbereich [retrieved on Aug. 7, 2020] XP055720874, p. 53-p. 55.

International Search Report (English and German) and Written Opinion of the ISA (German) issued in PCT/DE2020/100468, mailed Aug. 27, 2020; ISA/EP.

German International Preliminary Report on Patentability issued in PCT/DE2020/100468, dated Dec. 1, 2021.

\* cited by examiner

METHOD FOR EQUIPPING A MOUNTING PLATE WITH EQUIPPING COMPONENTS OF A SWITCHGEAR AND/OR CONTROL SYSTEM

CROSS-REFERENCE TO RELATED APPLICATIONS

This application is a U.S. National Phase Application under 35 U.S.C. 371 of International Application No. PCT/DE2020/100468, filed on Jun. 4, 2020, which claims the benefit of German Patent Application No. 10 2019 123 245.7, filed on Aug. 29, 2019. The entire disclosures of the above applications are incorporated herein by reference.

BACKGROUND

This section provides background information related to the present disclosure which is not necessarily prior art.

TECHNICAL FIELD

The invention relates to a method for equipping a mounting plate or the like with equipping components of a switchgear and/or control system.

DISCUSSION

In the production of switchgear and control systems, the process of equipping the mounting plate with equipping components such as mounting rails, electrical switching elements, cable ducts and the like is, in addition to the wiring of the switchgear, the central and most time-intensive work process, which is still mostly carried out manually. It is not only the complexity of this work process that places great demands on the people carrying out the assembly, but above all the need to ensure that it is carried out as faultlessly as possible.

The basis for the assembly of the components is a parts list of the components or the circuit diagram itself. In particular, the manual reading of the quantities and part numbers from the circuit diagram, which is often in paper format and in practice represents the most common form of instruction for manual assembly, is a time-consuming and error-prone process, as it is usually necessary to sift through a document comprising several hundred pages, which can only be understood with a basic understanding of electrical engineering.

Another complicating factor is that the majority of the components required are not picked and prepared for specific orders, but must be kept in stock at the workstation of the person carrying out the equipping in order to take the required quantities. The person carrying out the equipping must monitor the stock on his own responsibility and, if necessary, request replenishment from a central warehouse.

In most cases, the equipping and assembly of the components on the mounting plate is based on a design drawing with position information for mounting rails, cable ducts and the first components on each mounting rail. Equipping based on the circuit diagram alone is a common procedure in about 20% of cases. This usually requires many years of experience, since the circuit diagram does not contain any geometric information regarding the equipping components, but only functional information, and thus the positioning is based on empirical values and involves "trial and error" and manual pre-distribution of the components on the mounting plate. For these reasons, the step of equipping the mounting plate with components, which has so far been carried out almost exclusively manually, with its approx. 25% share of the total processing time, holds considerable potential for improvement both in qualitative terms and with regard to the processing time and the resulting costs.

SUMMARY

This section provides a general summary of the disclosure, and is not a comprehensive disclosure of its full scope or all of its features.

It is therefore one aspect of the invention to propose a method for the assembly of a mounting plate of a switchgear and/or control system which, on the one hand, ensures a high level of process reliability and, on the other hand, enables short processing times.

Accordingly, the process has the steps:

Reading planning data from a switchgear and/or control system into an automatic equipping machine that has a equipping robot;

Extracting position data of at least one assembly component to be mounted on the mounting plate and/or at least one machining position of the mounting plate from the planning data;

Detection of a spatial orientation and/or a position of the mounting plate with an image processing system of the equipping robot;

Assigning the position data to at least one position on the mounting plate; and

Execution of at least one processing or equipping step linked to the position on the mounting plate via the planning data at the position on the mounting plate with the equipping robot.

The invention makes use of the fact that the planning data, which are generated during the development of a switchgear or control system with the aid of modern software-supported engineering systems, for example with an ECAD or MCAD system, already hold all the information in digitized form which is required for the automated equipping of the mounting plate, for example position data, alignment data, mounting type data, component mounting form data, hole pattern data and the like. With the aid of a equipping robot, which can be an articulated-arm robot, for example, machine data for controlling the equipping robot can be generated on the basis of the aforementioned data, which permits the automated equipping of the mounting plate. The parts list contained in the planning data anyway can be used, for example, to specify an assembly sequence for the equipping robot. If the assembly components are fed to the equipping robot in a defined sequence at a defined transfer position that lies within the engagement range of the equipping robot and, in addition, the exact orientation of the assembly plate to be placed is known in relation to the equipping robot, process-reliable equipping of the assembly plate is possible. For example, a equipping layout can be extracted from the planning data, which has position data regarding the equipping components that can be used to generate machine data for controlling the equipping robot.

The assembly of the mounting plate can also include the machining of the mounting plate to the extent that the assembly robot performs necessary machining steps on the mounting plate derived from the planning data as required. For example, the planning data can have a hole pattern of the mounting plate, which can be introduced into the mounting plate by the equipping robot with the aid of a suitable tool device. It can also be provided that the pick-and-place machine, in particular the pick-and-place robot, only checks the presence of a prepared machining of the mounting plate, for example the presence of a borehole pattern.

Likewise, a borehole image already present in the mounting plate can also be used by the equipping robot to detect the spatial orientation and/or the position of the mounting plate in relation to the equipping machine or the equipping robot. For this purpose, the borehole can be detected with the image processing system of the equipping robot and compared with a borehole image stored in the planning data in order to determine, for example, an angular offset or lateral offset of the mounting plate with respect to a target position of the mounting plate with respect to the equipping robot or the equipping machine and to take this into account as an offset when determining the positions on the mounting plate by extracting corresponding position data from the planning data.

The planning data can be provided from a planning system, for example from an ECAD system. It can be provided that in a first step, before the planning data obtained from the planning system is read in, the planning data is checked with a test routine for automation suitability of the machining and/or equipping steps stored in the planning data. The method can also include optimizing processing or equipping steps that cannot be automated to the extent that they can be automated. For example, two components which, according to the planning data from the planning system, are arranged too close together to be positioned automatically on the mounting plate by the equipping robot and its end effector or to be wired in a wiring process following equipping can be positioned further apart, provided that this is permitted by the overall planning stored in the planning data.

The planning data can be read in manually or by automatic identification by reading in a product identification code, an RFID chip or similar. It can be provided that the planning data is loaded directly into the equipping machine. Alternatively, the pick-and-place machine can be connected to an external server on an IP basis, which can also be accessed by the planning system if necessary and can provide the planning data for retrieval by the pick-and-place machine. It can be provided that the extraction of the data required for the method according to the invention from the planning data, for example the extraction of position data of the equipping components to be mounted on the mounting plate, is carried out by the equipping machine itself or by a decentralized computer which, for example, has access to the aforementioned server or is hosted on it and provides correspondingly extracted data to the equipping machine via the server when requested by the equipping machine.

The method can further provide that before the mounting plate is loaded with the equipping components, the mounting robot scans the hole pattern formed in the mounting plate with the aid of its image processing system and compares the determined actual data of any holes found with the target data for the hole pattern stored in the planning data.

The mounting plate can be equipped with equipping components in particular with the aid of preassembled components, operating equipment and fastening elements. These can be divided into the following five main groups: Mounting rails, cable ducts, small and series components, large and individual components, and fasteners such as screws and/or rivets. These components can be provided in different versions so that they can be picked up by the equipping robot, positioned and, if necessary, mounted on the mounting plate. The mounting rails and cable ducts can be supplied to the pick-and-place machine preassembled, for example stacked or lined up on a transport cart from an automatic cutting machine. Alternatively, these two component types can also be cut to size directly at the pick-and-place machine in line with the process and supplied individually or via a buffer from where the pick-and-place robot picks up the mounting rails or cable ducts.

The small and series components can be arranged in a stationary or mobile manner via a transport cart, which contains various magazines that are picked on a project-specific basis and then transferred to the equipping robot, in particular in a defined orientation and position in relation to the equipping robot, so that the latter can pick up the components held in the magazines in a process-safe manner. In the magazines, the components can in particular be arranged in a predefined sequence which corresponds, for example, to an advantageous assembly sequence of the equipping components derived from the parts list.

The large and individual components, such as load-break switches and the like, can also be provided stationary or via a mobile transport cart for the equipping machine, which in turn is designed and arranged in relation to the equipping machine in such a way that process-safe removal of the components from the transport cart by the equipping robot is possible.

The fasteners, such as screws, rivets and the like, can be supplied either via a conveyor bowl or via a magazine, or transferred semi- or fully automatically to a fastening tool of the equipping robot. For example, a screw magazine can be supplied to an electric screwdriving tool, which has an adapter via which the tool can be adapted to the gripper on the end effector of the equipping robot, so that the equipping robot can maneuver the electric tool in a process-safe manner with respect to the mounting plate, for example in order to screw a mounting rail to the mounting plate.

The equipping robot can, for example, be designed as an articulated arm robot. Advantageously, the equipping robot has a multifunctional end effector, which simultaneously allows both the handling of the equipping components required for equipping and that of tooling devices and, in particular, can execute the movements required for this purpose, for example for positioning and engaging the components on the mounting plate or on a mounting rail. For example, the multifunctional end effector can be designed in such a way that it can receive and handle the various equipping components as well as a drilling module and a fastening system and place them on the mounting plate as required. In addition, the image processing system can be located on the end effector. This can have, for example, a camera or a scanner which can identify the orientation and/or the position of the mounting plate as well as any holes and breakouts and (already assembled) components on the mounting plate or on staging units such as transport carts.

For gripping and fixing the different equipping components, an end effector can be used which employs a force-controlled and/or disequipping-controlled gripping module. This ensures that the equipping components to be gripped by the gripper module during the equipping process, which can differ considerably from one another particularly with regard to their geometry, do not have to be taught in individually but can be gripped individually, whereby a minimum force can be applied to them regardless of their size, thus enabling process-reliable handling and fixing. With the equipping robot, in particular when it is equipped as an articulated-arm robot with a multifunctional end effector of the type described above, it can be achieved that the equipping of the components can be carried out both in the vertical direction from above, in the horizontal direction from the side, and in an oblique position in an angular range lying between the horizontal and the vertical.

After equipping or assembly of a component on the mounting plate, a function and quality inspection can be carried out by monitoring a defined pull-off force and/or by additionally checking a defined torque in screwdriving processes or the pull-off force in riveting processes.

Detecting the spatial orientation and/or a position of the mounting plate may comprise detecting an orientation and/or a position of at least one borehole, at least one borehole pattern, or at least one breakout in the mounting plate and matching at least one orientation and/or position detected thereby with a target extracted from the planning data.

At least one borehole, at least one borehole pattern, or at least one breakout can be inserted into the mounting plate by the equipping robot if at least one missing borehole, one missing borehole pattern, or one missing breakout has been detected during the adjustment deviating from the target specification.

The method may further comprise inserting at least one borehole, at least one borehole pattern, or at least one knockout into the mounting plate with the equipping robot. For this purpose, the equipping robot may use a gripper on its end effector to remove a tooling device from a reference position associated with the mounting plate. The tool device may be, for example, an electrically driven drill. The tool device can be, for example, a hand drill or a router, which is equipped with an adapter formed onto the drill or router housing in order to be able to be engaged and guided by the gripper in a process-safe manner.

The equipping robot can feed the tooling device removed from the reference position to a position on the mounting plate to which at least one machining step is assigned via the planning data, for example the insertion of at least one borehole, at least one borehole pattern, or at least one breakout in the mounting plate. Thereby, the equipping robot can execute the at least one machining step with the tooling device. In addition to spatially guiding the tool device with respect to the mounting plate, this may also include controlling the tool device, for example activating or deactivating a drive of the tool device.

The method may further comprise extracting a bill of materials of equipping components from the planning data and providing at least one of the equipping components included in the bill of materials at a component feeder disposed in the access area of the equipping robot.

Furthermore, the method may comprise picking up the equipping component from the access area with a gripper at the end effector of the equipping robot and labeling the picked up equipping component with a unique identifier extracted from the planning data, preferably from a parts list of the planning data.

The provision of at least one of the equipping components included in the parts list may comprise the provision of a plurality of identical equipping components, a single one of which is picked up by the equipping robot and provided with a unique identification. Instead of identical equipping components, magazine-loaded equipping components of different types can also be provided, whereby the equipping components are just arranged in the magazine in a equipping sequence that corresponds to a sequence in which the equipping robot positions the components on the mounting plate.

For labeling, the equipping component in question can be placed on a labeling unit by the equipping robot. The process can include optically readable labeling of the equipping component with the labeling unit and, after labeling, picking up the equipping component again from the labeling unit with the equipping robot.

The equipping component can be placed on the mounting plate by the equipping robot after it has been provided, picked up and marked. For this purpose, it can be provided that position data assigned to the equipping component is extracted from the planning data via the unique identification.

The equipping component can be released from the gripper at the end effector of the equipping robot after equipping, whereupon the equipping robot uses the gripper to pick up a fastening tool device, such as an electrically driven screwdriver or a riveting tool, from a device pick-up position, in which the equipping robot grips the fastening tool device with the gripper or picks it up via a changing system, such as a quick-change coupling, and feeds it to at least one fastening position on the mounting plate, for which purpose mounting position data assigned to the equipping component is extracted from the planning data.

The provision of at least one of the equipping components included in the bill of materials may comprise the provision of a mounting rail, which is removed from the component feeder by the equipping robot, placed at a mounting position on the mounting plate and mounted at the mounting position on the mounting plate. Subsequently, at least one further equipping component included in the parts list can be removed from the component feeder by the equipping robot and mounted on the mounting rail mounted on the mounting plate, preferably snapped onto the mounting rail. It is also possible to first place all the mounting rails, such as top-hat rails, on the mounting plate in their mounting position one after the other and only then mount the mounting rails on the mounting plate.

It can be provided that further assembly position data assigned to the further equipping component is extracted from the planning data, which specifies an assembly position of the further equipping component along the assembly rail. In the process, movement data assigned to the equipping component can be extracted from the planning data for mounting the further equipping component on the mounting rail, by means of which a mounting movement to be executed by the equipping robot for mounting the further equipping component on the mounting rail is specified.

The equipping component can be provided as a bar or continuous product and can be, for example, a cable duct or a mounting rail, such as a top-hat rail, the method comprising cutting the equipping component to length, for which purpose length data for a equipping component to be mounted on the mounting plate is extracted from the planning data. After cutting to length, the equipping component can be made available for removal by the equipping robot at a component feeder arranged in the access area of the equipping robot.

After the execution of the at least one machining or equipping step and a related quality inspection, a result of the quality inspection can be stored in the planning data and unambiguously assigned to the inspected equipping component or the inspected machining position via the position data of the planning data.

Preferably, at least all equipping component and tool movements are carried out by the equipping robot during the entire process with the same end effector and gripper of the equipping robot, for which purpose the gripper can have two mutually adjustable gripper jaws, preferably two plate-shaped gripper jaws which can be adjusted linearly in relation to one another and which clamp the respective element to be removed by adjusting the gripper jaws in relation to one another. To ensure reliable removal, the element to be removed, for example an assembly component, a tool device or the like, can engage with an adapter in a gripping area of the mutually adjustable gripper jaws.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
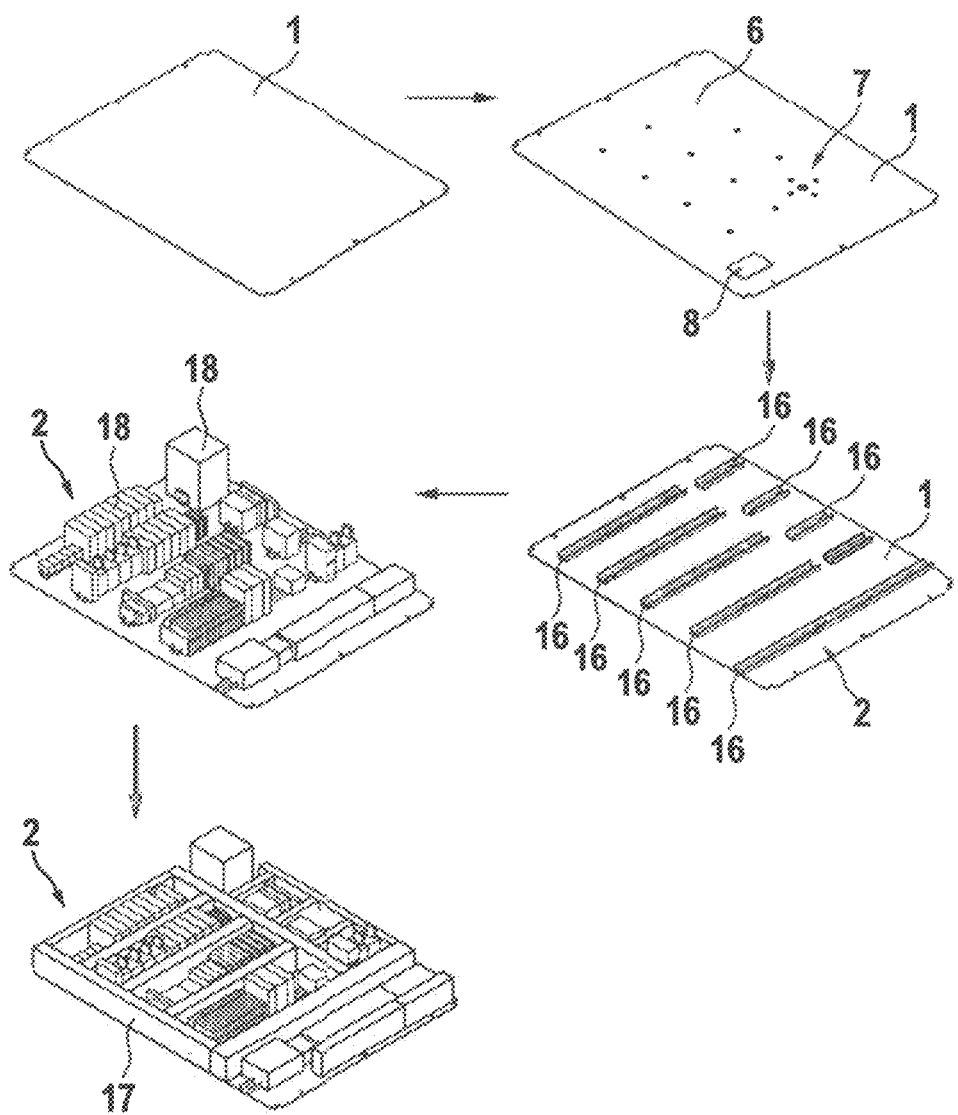
Figure 3:
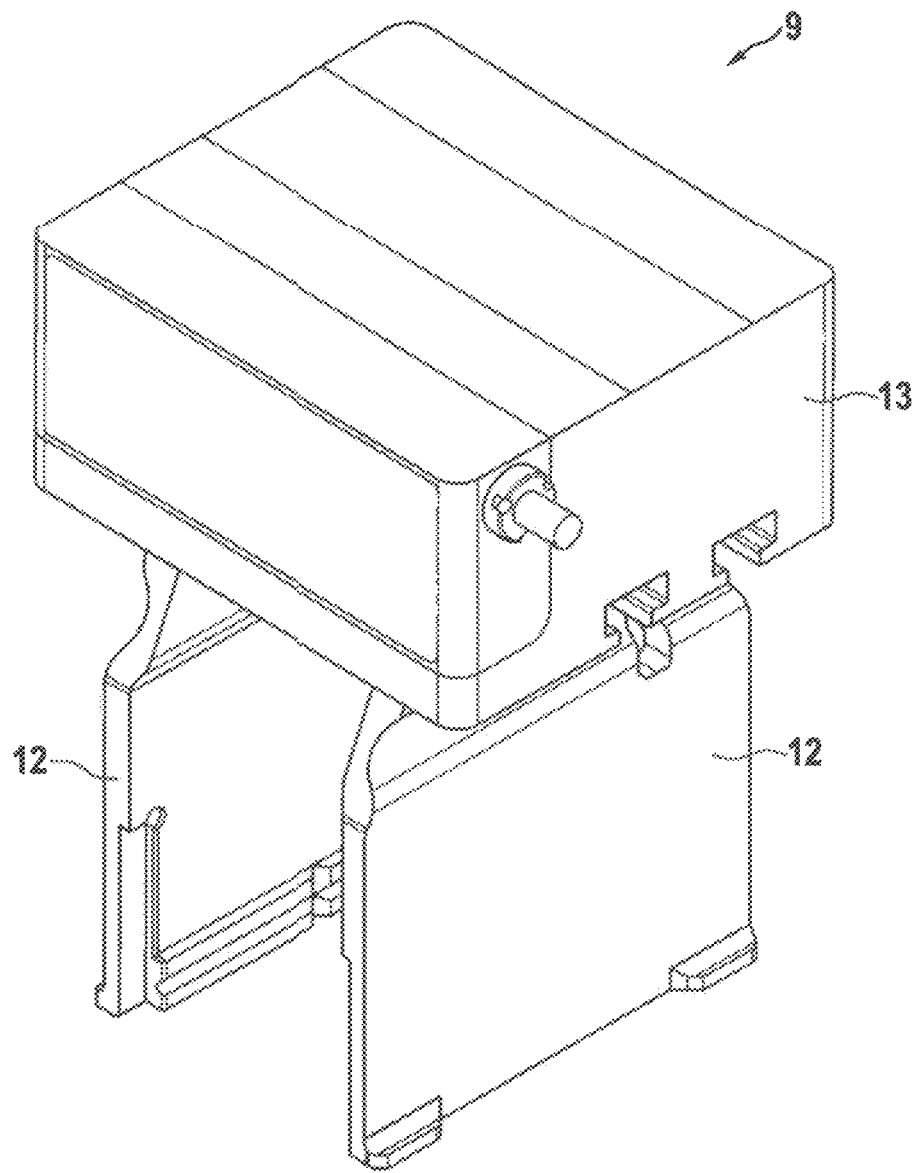
Figure 4:
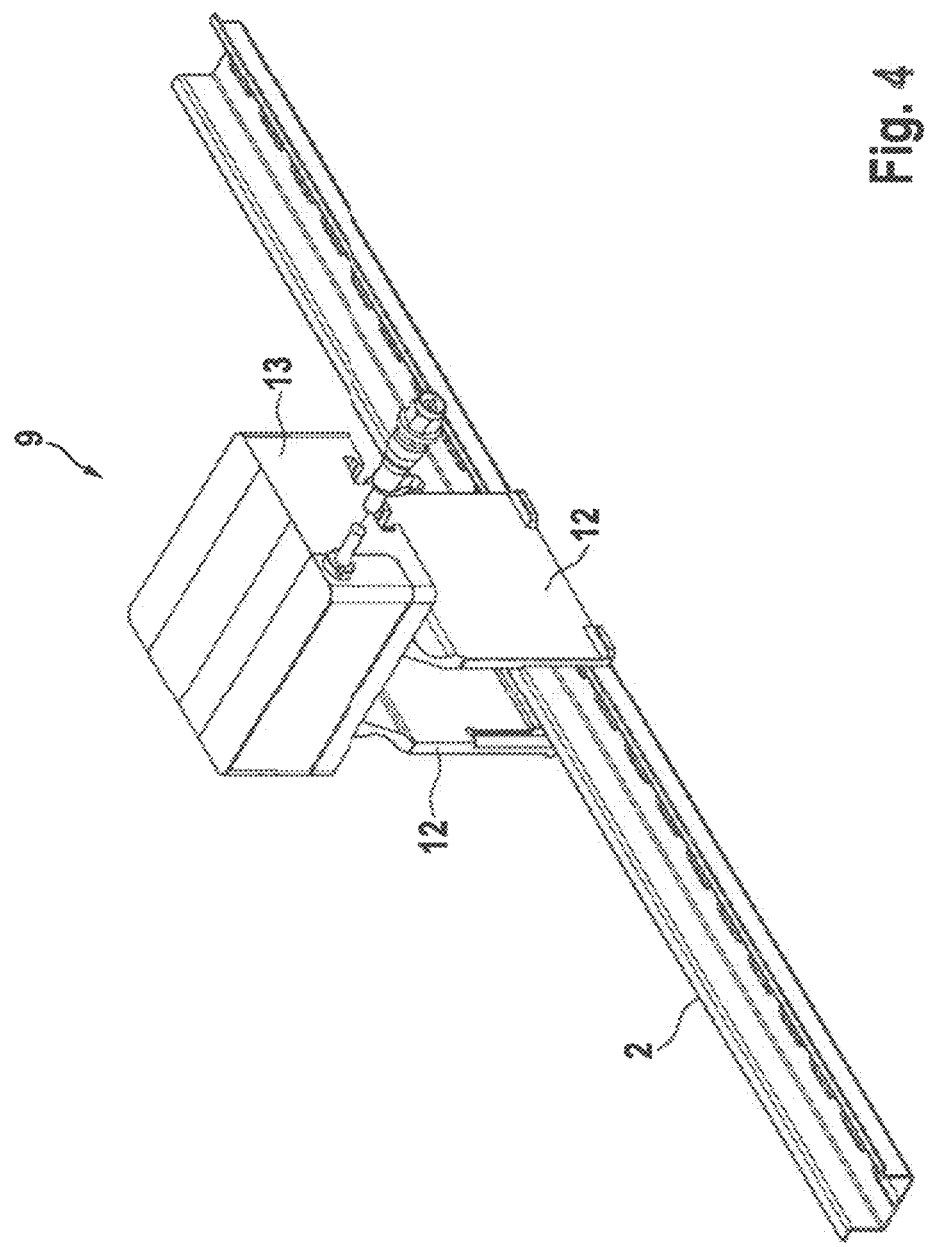
Figure 5:
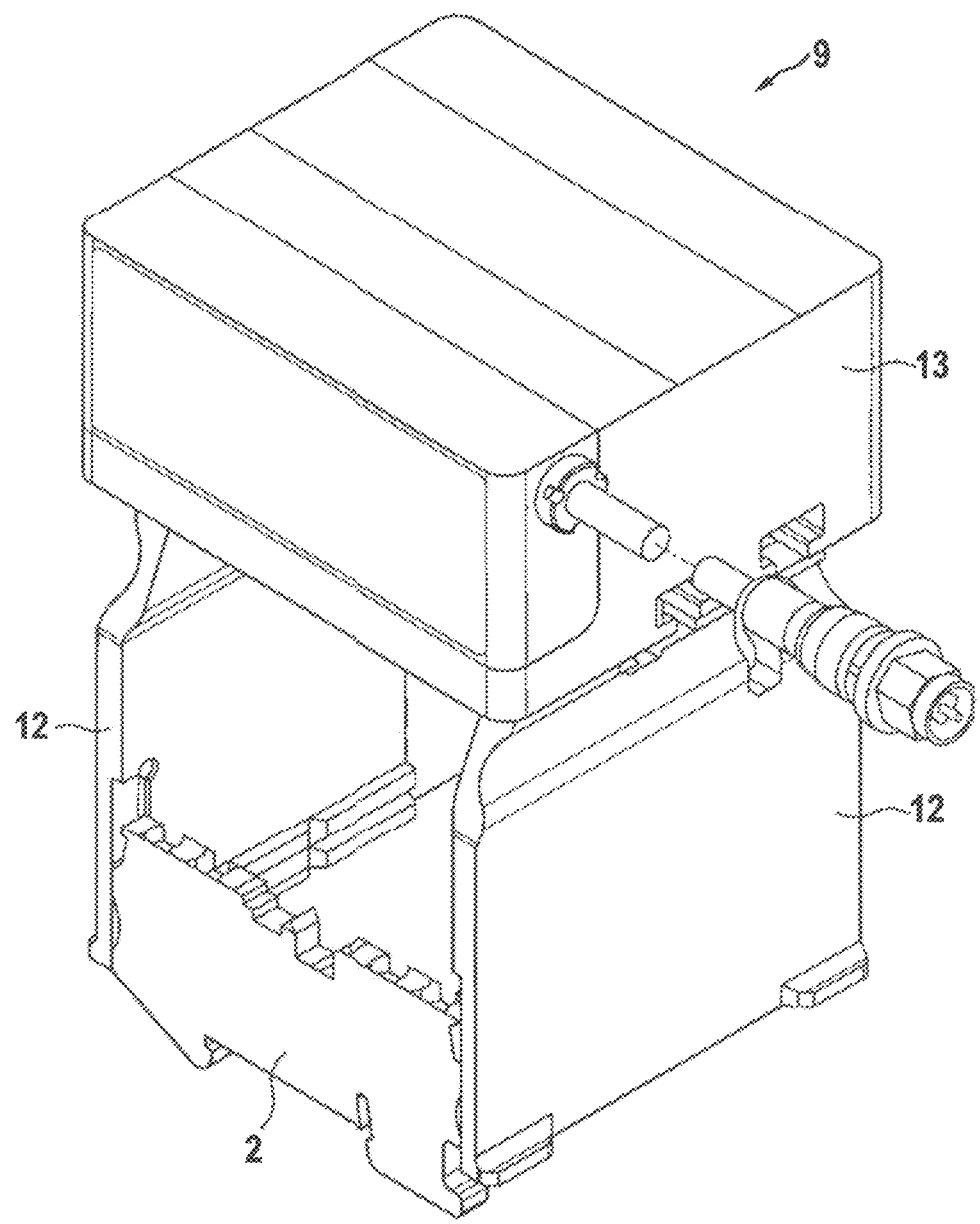

Further details of the invention are explained with reference to the figures below. Thereby shows:

FIG. 1 a schematic overview illustrating an embodiment of the process according to the invention;

FIG. 2 a schematic diagram of the assembly of a mounting plate with components;

FIG. 3 an exemplary embodiment of a multifunctional gripper for use in a process according to the invention;

FIG. 4 the use of the gripper according to FIG. 3 for maneuvering a mounting rail; and FIG. 5 the use of the gripper according to FIG. 3 for maneuvering a terminal block.

DETAILED DESCRIPTION

Example embodiments will now be described more fully with reference to the accompanying drawings.

FIG. 1 shows a schematic system structure for implementing the method according to one embodiment of the invention. Accordingly, an automatic pick-and-place machine 3 can have a pick-and-place robot 4, which in the present case is designed as an articulated-arm robot and has a multifunctional end effector 10 at its gripper end, as well as an image processing system 5. The image processing system 5 can have a camera, a scanner or another electromagnetic measuring device, in particular a device for optical detection of the surface of the mounting plate 1 and, if applicable, of equipping components 2 arranged thereon or of holes and cutouts made therein.

The mounting plate 1 is fed to the automatic equipping machine 3 by a transport cart 15, preferably aligned horizontally. For example, the transport cart 15 can be set up to enable the assisted removal of the mounting plate from a pre-assembled control cabinet without the load of the mounting plate 1 having to be held by a person carrying out the transfer of the assembly. Accordingly, it can be provided that the transport cart 15 has suitable holders and fastening means with the aid of which the mounting plate 1 can be removed from the switch cabinet and fastened to the transport cart 15. After the mounting plate 1, which is mounted vertically in the switch cabinet, has been removed from the switch cabinet, the mounting plate 1 can be pivoted with the transport cart 15 into the horizontal position shown in FIG. 1 and fed to the automatic equipping machine 3. After the mounting plate 1 has been fitted with components 2 using the automatic equipping machine 3, it can be reintroduced into the control cabinet with the transport cart 15 and fixed there manually or semi-automatically if necessary. For the complete handling of the mounting plate 1 from the removal of the mounting plate 1 from the control cabinet to the return of the mounting plate 1 into the control cabinet, the mounting plate 1 can be permanently held and maneuvered with the transport cart 15, so that no force-consuming manual handling of the mounting plate 1 is required in this respect either.

The assembly process is illustrated in the synopsis of FIGS. 1 and 2. After the mounting plate 1 has been brought into the horizontal position in the manner described above and fed to the pick-and-place machine 3 and, in particular, to the pick-and-place robot 4 of the pick-and-place machine 3, the pick-and-place robot 4 can, in a first processing step, check the exact alignment of the mounting plate 1 with respect to the robot 4, so that the handling of the mounting plate 1 is also facilitated to the extent that it is not absolutely necessary to manually create the mounting plate 1 in a precise, defined position in order to enable process-reliable processing or equipping of the mounting plate 1.

The detection of the orientation of the mounting plate 1 with respect to the equipping robot 4 can be carried out, for example, using the image processing system 5 at the end effector 10 of the equipping robot 4, in that this system optically detects, for example, a borehole image or another optically detectable concise contour on the upper side of the mounting plate 1 and compares a desired orientation of the mounting plate 1 with an actual orientation of the mounting plate 1 by image processing and calculates an offset from this, if necessary.

The nominal orientation of the mounting plate 1 and all additional planning data required for the assembly of the mounting plate 1 can be provided directly from a planning system, for example from an ECAD system and/or from an MCAD system. The target orientation of the mounting plate 1 can be determined by the planning system to the equipping machine 3 directly or indirectly (via a server or cloud-based) based on the planning data provided. The planning data may, for example, contain a target borehole image, which is matched in the manner described above with an actual borehole image acquired by the image processing system 5 to determine the orientation of the mounting plate 1 with respect to the equipping robot 4.

Before the actual equipping of equipping components 2 on the mounting plate 1 begins, provision can be made for the project to be placed to be checked for its suitability for automation using a test routine and, if necessary, manipulated if the check reveals at least one equipping step that cannot be automated, for example because the equipping robot 4, in particular the end effector 10 with its gripper 9, is unsuitable for the equipping step in question. In particular, the optimization can be carried out to the effect that all equipping steps can be carried out at least to the greatest possible extent with the same end effector 10, in particular with the same gripper 9 at the end of the end effector 10 (cf. FIGS. 3 to 5), so that at the end of the process an essentially completely populated mounting plate 1 is actually provided, which requires no or at most very minor manual rework. Optimization of the equipping process can be performed by the equipping machine 3 itself or decentrally on a server, for example cloud-based, which can be accessed by both the ECAD system or other planning system and the equipping machine 3.

The determination of the relative orientation of the mounting plate 1 with respect to the pick-and-place machine 3 and in particular the pick-and-place robot 4 may comprise optically detecting, for example scanning, the entire surface of the mounting plate 1, so that in the same work step the complete hole pattern already formed on the mounting plate, if any, which may for example have boreholes, cutouts and the like for the mounting of pick-and-place components, is detected. The hole pattern determined as part of the complete detection of the mounting plate 1 can be compared with corresponding hole pattern data that can be extracted from the planning data. This extraction process can again be performed by the automatic equipping machine 3 itself or decentrally on a server, for example cloud-based, to which the automatic equipping machine 3 has access. If the check reveals that a borehole, a breakout or other mechanical processing of the mounting plate 1, which should be present according to the installed hole pattern data, is not present, this hole or breakout can be introduced into the mounting plate 1 by a processing step carried out by the equipping robot 3. For this purpose, the equipping robot 4 can use its end effector 10 to pick up a suitable tool device 11 from a tool transfer interface of the equipping machine 3, guide it to the mounting plate 1 and control the tool device 11 in such a way that the required machining of the mounting plate 1 is performed. The tool devices 11 can, for example, be hand-held machining devices known from the prior art, for example a hand-held drilling machine, which has on its housing an adapter 20 formed on or subsequently mounted on it, which is compatible with the gripper 9 (cf. FIGS. 3 to 5) of the end effector 10, so that the equipping robot 4 can handle the tool device 11 in a process-safe manner.

After it has been verified, if necessary by scanning the top of the mounting plate again with the image processing system 5, that the actual hole pattern introduced into the mounting plate 1 corresponds to a target hole pattern according to the hole pattern data from the planning data, the actual assembly process of the mounting plate 1 can begin. The automated assembly of the mounting plate 1 can be carried out with the aid of pre-assembled components/supplies and fastening elements. As shown in FIG. 1, the components 2 can, for example, be assigned to the pick-and-place machine 3 using transport carts 15 so that the pick-and-place robot 4 can remove the components 2 from the respective transport cart 15 in a process-safe manner. Small components 2, for example terminal blocks, can be stored in magazines 19.

The equipping components 2 can, for example, be divided into the following five main groups: Mounting rails, cable ducts, small and series components, large and individual components, and fasteners, such as screws, rivets and the like. The mounting rails and cable ducts can, for example, be transferred in a preassembled state, for example stacked or lined up, on the transport cart from a corresponding cutting system for cutting mounting rails and/or cable ducts to the automatic equipping machine 3. Alternatively, mounting rails and cable ducts in particular can also be cut directly at the automatic equipping machine 3 from bar stock or continuous goods in a process-related manner and provided individually or via a buffer at a transfer interface from which the equipping robot 4 can take the respective component 4. Similarly, the small and series components can be loaded or picked in the goods receiving area in a stationary or mobile manner via a transport cart 15 which has various magazines 19 and then transferred to the pick-and-place machine 3 and, if necessary, coupled or fixed to the pick-and-place machine 3 for the purpose of defined alignment of the magazines 19 with respect to the pick-and-place machine 3. The large and individual components can also be provided stationary or via a mobile transport cart 15, which for example has different levels and thus offers the possibility of picking with the end effector 10.

The fasteners, such as screws, rivets and the like, are supplied either via a feed bowl or via a magazine, or are transferred to the fastening system semi- or fully automatically. For example, one of the tool devices 11 can be designed as an electric screwdriver to which suitable screws are fed via a screw magazine.

In addition, the pick-and-place machine 3 shown in FIG. 1 has a labeling unit 14 that enables individual labeling of the pick-and-place components. For example, the marking unit 14 can have a marking laser. It is thus possible, for example, for the equipping robot 4 to remove a equipping component 2, for example a terminal block, from the magazine 19, which, according to a parts list extracted from the planning data, is a next component to be mounted on the switchgear and/or control system to be created on the mounting plate 1. The component taken from the magazine 19 can be deposited by the equipping robot 4 on the labeling unit 14 or brought close to it before being mounted on the mounting plate 1, whereupon the component is given an individual labeling by the labeling unit 14, which is either predetermined by the planning data or generated by the equipping robot 3 itself and subsequently stored in the planning data. Once the equipping component 2 has been labeled, it can then be mounted on the mounting plate 1 by the equipping robot 4.

In particular, the process according to the invention allows, for example, a top-hat rail for mounting terminal blocks to be mounted on the mounting plate 1, even before the terminal blocks are mounted on the top-hat rail, in deviation from the processes known from the prior art. In particular, this has the advantage that for handling and mounting the top-hat rail on the mounting plate 1, no free space has to be left at the opposite ends of the top-hat rail to allow subsequent screwing of the top-hat rail to the mounting plate 1. Instead, the method according to the invention allows the top-hat rail, since it is already fixed to the mounting plate, to be equipped over its entire length with assembly components, for example with terminal blocks, so that better utilization of the mounting surface of the mounting plate 1 is achieved. The above principle is transferable to other rail-based mounting systems commonly used in switchgear construction and, in particular, is not limited to DIN rails for mounting terminal blocks.

For example, a mounting rail can be removed from the transport cart 15, placed on the labeling unit 14 and, after being labeled by the labeling unit 14, positioned on the mounting plate 1 in accordance with the planning data, in particular the position data of the planning data, and screwed to the mounting plate 1 or otherwise fastened to it. After the mounting rail 16 has been fastened to the mounting plate 1, the equipping robot 4 can be used, for example, to remove a terminal block from the magazine 19, to label it with the aid of the labeling unit 14, and thereupon to snap it onto the mounting rail 16, which may in particular be a top-hat rail. The equipping components 2 accommodated in the magazine 19 can, for example, be preassembled in a defined sequence which corresponds to a sequence of the equipping components with which they are fastened to the mounting rail 16. This storage is particularly useful if not only components of the same type are to be lined up on the top-hat rail, but also components that are structurally different. Components of the same design are individualized exclusively with the aid of the labeling unit 14.

After the mounting plate 1 has been provided with mounting rails 16 and electrical components 18 mounted thereon, cable ducts 17 can be mounted on the mounting plate in an analogous manner.

FIGS. 3 to 5 show an exemplary embodiment of a gripper 9 which can be used for an end effector 10 (see FIG. 1) and is characterized in particular by the fact that it is suitable for handling a wide variety of equipping components and tooling devices. This essentially has an adjustment unit 13, which can be a linear adjustment unit, and with the aid of which two gripper jaws 12, which can be plate-shaped, can be adjusted relative to one another, in particular linearly.

FIGS. 4 and 5 show that the contours formed on the opposite inner sides of the gripper jaws 12 enable the handling of a wide variety of components, for example, on the one hand the handling of mounting rails such as top-hat rails (see FIG. 4), or on the other hand the handling of electrical components such as conductor connection terminals (see FIG. 5).

The features of the invention disclosed in the foregoing description, in the drawings as well as in the claims may be essential to the realization of the invention both individually and in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A method for equipping a mounting plate with equipping components of a switchgear and/or control system, the method comprising the steps:
   reading planning data of the switchgear and/or control system by an automatic equipping machine, which has an equipping robot;
   extracting position data of at least one of the equipping components to be mounted on the mounting plate and/or at least one machining position of the mounting plate from the planning data;
   detecting a spatial orientation and/or a position of the mounting plate with an image processing system of the equipping robot;
   assigning the position data to at least one position on the mounting plate; and
   executing at least one machining step and one equipping step linked to the position on the mounting plate via the planning data at the position on the mounting plate with the equipping robot,
   wherein the detecting comprises detecting an orientation and/or a position of at least one borehole, at least one borehole pattern, or at least one breakout in the mounting plate and comparing at least one of the detected spatial orientation and/or position detected thereby with a target specification extracted from the planning data to determine if the detected orientation and/or position is correct;
   wherein the machining step is performed by machining at least one new borehole, at least one new borehole pattern, or at least one new breakout into the mounting plate with the equipping robot that matches the target specification; and
   wherein the equipping step is performed by equipping the mounting plate with the at least one equipping component.

2. The method according to claim 1, wherein the machining of the at least one borehole, the at least one borehole pattern, or the at least one breakout into the mounting plate with the equipping robot comprises the equipping robot using a gripper on an end effector of the equipping robot to remove a tool device from a reference position associated with the mounting plate.

3. The method according to claim 2, in which the equipping robot feeds the tool device removed from the reference position to a position on the mounting plate to which the at least one machining step is assigned via the planning data, the introduction of the at least one borehole, the at least one borehole pattern, or the at least one breakout into the mounting plate, and in which the equipping robot executes the at least one machining step with the tool device.

4. The method according to claim 1, comprising extracting a bill of materials of the at least one equipping components from the planning data and providing at least one of the at least one equipping components included in the bill of materials at a component feeder arranged in an access area of the equipping robot.

5. The method according to claim 4, comprising picking up the equipping component from the access area with a gripper at an end effector of the equipping robot and marking the picked-up equipping component with a unique identifier extracted from the bill of materials.

6. The method of claim 4, wherein providing at least one of the equipping components included in the bill of materials comprises providing a plurality of identical of the at least one equipping components, a single one of which is picked up by the equipping robot and marked with the unique identifier.

7. The method of claim 5, wherein the marking comprises placing the equipping component on a labeling unit with the equipping robot and optically readably labeling the equipping component with the labeling unit, and after the labeling, picking up the equipping component again from the labeling unit with the equipping robot.

8. Method according to claim 5, in which the equipping component is placed on the mounting plate by the equipping robot after being provided, picked up and marked, for which purpose position data associated with the equipping component are extracted from the planning data via the unique marking.

9. The method according to claim 8, in which the equipping component is released by the gripper at the end effector of the equipping robot after equipping, whereupon the equipping robot uses the gripper to pick up a tool device from a device pick-up position, in that the equipping robot grips the tool device with the gripper or picks the tool device up via a changing system and feeds it to at least one fastening position on the mounting plate, for which purpose mounting position data assigned to the equipping component are extracted from the planning data.

10. The method according to claim 4, wherein providing at least one of the equipping components included in the bill of materials comprises providing a mounting rail that is removed from the component feeder by the equipping robot, placed at a mounting position on the mounting plate, and mounted at the mounting position on the mounting plate, wherein subsequently at least one further equipping component contained in the parts list is removed from the component feed by the equipping robot and mounted on the mounting rail mounted on the mounting plate, preferably snapped onto the mounting rail.

11. The method according to claim 10, wherein further mounting position data associated with the further equipping component is extracted from the planning data specifying a mounting position of the further equipping component along the mounting rail, wherein for mounting the further equipping component on the mounting rail, movement data associated with the equipping component is extracted from the planning data, by means of which movement data a mounting movement to be executed by the equipping robot for mounting the further equipping component on the mounting rail is specified.

12. The method according to claim 1, wherein the at least one equipping component is provided as bar stock or continuous stock, the method comprising cutting the equipping component to length, for which purpose length data for a equipping component to be mounted on the mounting plate are extracted from the planning data, and wherein the equipping component, after being cut to length, is made available at a component feeder, which is arranged in an access area of the equipping robot, for removal by the equipping robot.

13. The method according to claim 3, in which, after the execution of the at least one machining or equipping step and a related quality inspection, a result of the quality inspection is stored in the planning data and is unambiguously assigned to the equipping component or the machining position via the position data of the planning data.

14. The method according to claim 2, wherein the removal by the equipping robot are carried out with the same end effector and gripper of the equipping robot, for which purpose two mutually adjustable gripper jaws which are linearly adjustable relative to one another, clamp the respective element to be removed by adjusting the gripper jaws, and for which purpose the element to be removed engages with an adapter in a gripping region of the gripper jaws which are adjustable relative to one another.

* * * * *